United States Patent
Ishizuka et al.

(10) Patent No.: US 8,466,538 B2
(45) Date of Patent: Jun. 18, 2013

(54) SOI WAFER, SEMICONDUCTOR DEVICE, AND METHOD FOR MANUFACTURING SOI WAFER

(75) Inventors: Tohru Ishizuka, Annaka (JP); Nobuhiko Noto, Annaka (JP); Norihiro Kobayashi, Annaka (JP); Masatake Nakano, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 232 days.

(21) Appl. No.: 12/867,922

(22) PCT Filed: Feb. 19, 2009

(86) PCT No.: PCT/JP2009/000700
§ 371 (c)(1),
(2), (4) Date: Aug. 17, 2010

(87) PCT Pub. No.: WO2009/116227
PCT Pub. Date: Sep. 24, 2009

(65) Prior Publication Data
US 2010/0314722 A1    Dec. 16, 2010

(30) Foreign Application Priority Data
Mar. 19, 2008   (JP) ................................. 2008-072174

(51) Int. Cl.
*H01L 29/04* (2006.01)
(52) U.S. Cl.
USPC ........................................ 257/627

(58) Field of Classification Search
USPC ........................ 257/627, 628; 438/455, 458
See application file for complete search history.

(56) References Cited

U.S. PATENT DOCUMENTS

| | | | |
|---|---|---|---|
| 7,002,214 B1 * | 2/2006 | Boyd et al. | 257/351 |
| 7,473,971 B2 * | 1/2009 | Yamazaki et al. | 257/347 |
| 7,569,857 B2 * | 8/2009 | Simon et al. | 257/69 |
| 7,674,720 B2 * | 3/2010 | Wang et al. | 438/739 |
| 7,879,658 B2 * | 2/2011 | Ozawa et al. | 438/150 |
| 8,053,837 B2 * | 11/2011 | Yamazaki | 257/347 |
| 8,076,231 B2 * | 12/2011 | Saitoh et al. | 438/592 |

(Continued)

FOREIGN PATENT DOCUMENTS

| | | |
|---|---|---|
| JP | A-09-246505 | 9/1997 |
| JP | A-09-320912 | 12/1997 |

(Continued)

OTHER PUBLICATIONS

International Preliminary Report on Patentability issued in Application No. PCT/JP2009/000700; Dated Nov. 2, 2010.

(Continued)

*Primary Examiner* — Nathan Ha
(74) *Attorney, Agent, or Firm* — Oliff & Berridge, PLC

(57) ABSTRACT

The present invention is an SOI wafer comprising at least: an SOI layer; a silicon oxide film; and a base wafer, wherein the SOI layer has a plane orientation of (100), and the base wafer has a resistivity of 100 Ω·cm or more and a plane orientation different from (100). As a result, there is provided the SOI wafer and the manufacturing method thereof that have no complicated manufacturing step, defects on a bonding interface which are not practically a problem in number and a high interface state density (Dit) for trapping carriers on an interface of a BOX layer and the base wafer.

5 Claims, 5 Drawing Sheets

U.S. PATENT DOCUMENTS

| | | | |
|---|---|---|---|
| 8,187,926 B2* | 5/2012 | Yamazaki | 438/149 |
| 8,236,634 B1* | 8/2012 | Kanike et al. | 438/155 |
| 2004/0002197 A1 | 1/2004 | Fathimulla et al. | |
| 2004/0004271 A1* | 1/2004 | Fukuda et al. | 257/616 |
| 2004/0219370 A1 | 11/2004 | Aga et al. | |
| 2005/0003648 A1 | 1/2005 | Mitani et al. | |
| 2006/0166451 A1 | 7/2006 | Raskin et al. | |
| 2007/0032040 A1 | 2/2007 | Lederer | |
| 2007/0054459 A1 | 3/2007 | Aga et al. | |
| 2008/0224274 A1* | 9/2008 | Yamazaki et al. | 257/627 |
| 2009/0236698 A1* | 9/2009 | Yamazaki et al. | 257/627 |

FOREIGN PATENT DOCUMENTS

| | | |
|---|---|---|
| JP | A-2002-305292 | 10/2002 |
| JP | A-2005-532679 | 10/2005 |
| JP | A-2007-507093 | 3/2007 |
| JP | A-2007-507100 | 3/2007 |
| WO | WO 03/049189 A1 | 6/2003 |
| WO | WO 2004/003997 A2 | 1/2004 |
| WO | WO 2005/031842 A2 | 4/2005 |
| WO | WO 2005/031853 A1 | 4/2005 |

OTHER PUBLICATIONS

Office Action issued in Japanese Application No. 2008-072174 dated Apr. 19, 2011, (with partial translation).

International Search Report issued in Application No. PCT/JP2009/000700; Dated Mar. 31, 2009.

Japanese Office Action issued in Application No. JP 2008-072174 dated Aug. 2, 2011 (w/ English Translation).

* cited by examiner (a)

(b)

SOI WAFER, SEMICONDUCTOR DEVICE, AND METHOD FOR MANUFACTURING SOI WAFER

TECHNICAL FIELD

The present invention relates to an SOI (Silicon On Insulator) wafer that is manufactured by bonding silicon single crystal wafers to each other, and more particularly to an SOI wafer using a high-resistance wafer having a resistivity of 100 Ω·cm or more for a base wafer.

BACKGROUND ART

With spread of mobile phones, an RF (Radio Frequency) device primarily intended for a communication interface has attracted attention and it is considered to rapidly evolve in the future.

For example, in case of a mobile phone, when an SOI wafer is used, there is a merit of a reduction in power consumption due to a decrease in leak current. Further, using System on a Chip (SoC) or the like to incorporate the RF device is also considered, and using an SOI wafer can provide a merit of reducing crosstalk between devices in terms of characteristics of an RF transistor.

Here, the crosstalk means propagation of an undesired electrical signal between devices, and the signal is transmitted or received through a capacitor between wiring lines of devices or through a wafer. Although the crosstalk is reduced as a resistivity of the wafer is increased, a wafer resistivity of a device forming portion cannot be actually extremely increased.

However, when the SOI wafer is used, since a buried oxide film layer (a BOX layer) is present between an SOI layer and a base wafer, the crosstalk can be reduced.

Furthermore, since a device is not formed on the base wafer serving as an underlying layer of the BOX layer, a high-resistance wafer can be used without being subject to limitation of device formation, thereby improving RF characteristics.

As described above, at the time of using an SOI wafer for an RF device, utilizing a high-resistance base wafer enables improving RF characteristics. However, when the high-resistance wafer is used, a reversal layer may be generated on an interface between a BOX layer and the base wafer, and an effect of using the high-resistance wafer is reduced in such a case.

As a countermeasure, there is disclosed a technology that increases an interface state density (Dit) to trap carriers in an interface state, thereby preventing characteristics from being degraded due to the reversal layer.

As such a technology, for example, there is known a technology that introduces an intermediate layer such as a polysilicon layer or a nitride oxide to an interface between a BOX layer and a base wafer to prevent the reversal layer from being formed, thereby obtaining an SOI wafer having excellent RF characteristics (see, e.g., Patent application publication No. 2007-507093 and Patent application publication No. 2007-507100).

However, such a technology has a demerit that not only manufacturing steps of an SOI wafer are complicated but also defects on a bonding interface such as voids or blisters are apt to be produced.

DISCLOSURE OF INVENTION

In view of the above-described problem, it is an object of the present invention to provide an SOI wafer in which the number of defects on a bonding interface is not practically a problem and which has a high interface state density (Dit) for trapping carriers on an interface between a BOX layer and a base wafer without complicated manufacturing steps and to a manufacturing method thereof.

To achieve the problem, according to the present invention, there is provided an SOI wafer comprising at least: an SOI layer; a silicon oxide film; and a base wafer, wherein the SOI layer has a plane orientation of (100), and the base wafer has a resistivity of 100 Ω·cm or more and a plane orientation different from (100).

As described above, the SOI wafer according to the present invention is characterized in that a silicon single crystal wafer having the resistivity that is as high as 100 Ω·cm or more and having the plane orientation different from (100) is used as a base wafer.

It has been revealed that the number of interface states on an interface between the silicon oxide film as a BOX layer which traps carriers and the base wafer is dependent on the number of dangling bonds on a base wafer surface, and the number of the dangling bonds becomes larger on a surface of the silicon single crystal wafer having the plane orientation different from (100) than a surface of a silicon single crystal wafer having a plane orientation (100). In the SOI wafer using such a high-resistivity silicon single crystal wafer having the plane orientation different from (100) as the base wafer, since an interface state density of the interface between the BOX layer and the base wafer is high, the SOI wafer that can readily trap carriers and suppress degradation in RF characteristics caused due to formation of the reversal layer, i.e., that has excellent RF characteristics can be provided.

Moreover, since the silicon single crystal wafer is used, crystallinity is good, and the configuration in which the silicon single crystal wafer having the plane orientation (100) is in contact with the silicon single crystal wafer having the plane orientation different from (100) through the oxide film, whereby the configuration is not complicated and manufacturing steps themselves are not complicated either, thus providing the SOI wafer having the reduced number of defects on the bonding interface.

Additionally, it is preferable that the base wafer has plane orientation of (110), or has plane orientation of (111), or the base wafer is subjected to off-angle of 1 degree or above and less than 45 degrees from (100).

In the silicon single crystal wafer having plane orientation of (110), or having plane orientation of (111), or the silicon single crystal wafer subjected to off-angle of 1 degree or above and less than 45 degrees from (100), the number of dangling bonds on the surface thereof is larger than that of the (100) wafer. The SOI wafer using a high-resistivity wafer having the plane orientation described above as the base wafer can be having a higher interface state density (Dit) for trapping carriers on the interface between the BOX layer and the base wafer.

Further, according to the present invention, there is provided a semiconductor device comprising at least an RF device formed on the SOI layer of the SOI wafer according to the present invention.

Since the SOI wafer according to the present invention has excellent RF characteristics as described above, the semiconductor device having the RF device formed on the SOI layer of the SOI wafer described above has excellent RF characteristics.

Furthermore, according to the present invention, there is provided a method for manufacturing an SOI wafer comprising at least: bonding a base wafer and a bond wafer, each of which is formed of a silicon single crystal, to each other through a silicon oxide film; and reducing a film thickness of the bond wafer to form an SOI layer, wherein the bond wafer having a plane orientation of (100) is used, and the base wafer having a resistivity of 100 Ω·cm or more and a plane orientation different from (100) is used.

When the silicon single crystal wafer which has the high resistivity of 100 Ω·cm or more, the dangling bonds on the surface thereof being larger in number than those on a wafer having a plane orientation (100) and the plane orientation different from (100) is used as the base wafer as described above, the interface state density of the interface between the BOX layer of the SOI wafer and the base wafer can be increased. As a result, carriers can be readily trapped, whereby the SOI wafer that can suppress degradation in characteristic due to formation of the reversal layer, i.e., the SOI wafer that has excellent RF characteristics can be manufactured.

Moreover, since the silicon single crystal wafer is used for manufacture, crystallinity of the SOI wafer can be good.

Additionally, since manufacture can be carried out by bonding the silicon single crystal wafers to each other through the silicon oxide film and reducing the film thickness of the bond wafer, conventional manufacturing steps can be applied except for the plane orientation of the base wafer to be used, the manufacturing steps are simplified, and the SOI wafer manufacturing method that can reduce a manufacturing cost can be realized.

Further, it is preferable to use one of the base wafer having plane orientation of (110), or the base wafer having plane orientation of (111), or the base wafer subjected to off-angle of 1 degree or above and less than 45 degrees from (100).

In the silicon single crystal wafer having plane orientation of (110), or the silicon single crystal wafer having plane orientation of (111), or the silicon single crystal wafer subjected to off-angle of 1 degree or above and less than 45 degrees from (100), since the number of dangling bonds on the surface thereof is larger in number than that of the silicon single crystal wafer having the plane orientation (100), the SOI wafer having the high interface state density (Dit) between the BOX layer and the base wafer can be manufactured by using the high-resistivity silicon single crystal wafer having the plane orientation described above for the base wafer.

Furthermore, the bond wafer has an ion-implanted layer formed near a surface thereof by implanting at least one of a hydrogen ions and a rare gas ions from the surface thereof, and a film thickness of the bond wafer is reduced by bonding the bond wafer to the base wafer through the silicon oxide film and then performing delamination at the ion-implanted layer.

When the film thickness of the bond wafer is reduced based on a so-called ion implantation and delamination method, the film thickness of the SOI layer to be reduced can be uniform and thin, and surface roughness of a cleavage plane can be decreased, thereby obtaining the SOI wafer having high flatness.

Moreover, the silicon oxide film is formed on a surface of the base wafer, and then the base wafer can be bonded to the bond wafer.

When the oxide film is formed on the bond wafer to determine the interface between the BOX layer and the base wafer as the bonding interface, the interface state density of this interface becomes higher than that when the interface is not the bonding interface. However, like a situation where the oxide film must be formed on the base wafer, e.g., a situation where warpage of an SOI wafer must be reduced or a situation where the thick BOX layer must be required in the ion implantation and delamination method, the method for manufacturing an SOI wafer according to the present invention can sufficiently increase the interface state density (Dit) because it is based on the difference in plane orientation, and hence the SOI layer with a large film thickness that has excellent RF characteristics can be manufactured, for example.

As described above, in the SOI wafer according to the present invention, since the silicon single crystal wafer which has the plane orientation different from (100) and the high resistivity is used as the base wafer, manufacture of the SOI wafer itself is very easy, and defects on the bonding interface are not generated, and the desired SOI wafer having the high interface state density on the interface between the BOX layer and the base wafer is provided.

BEST MODE(S) FOR CARRYING OUT THE INVENTION

The present invention will now be described in more detail hereinafter.

As described above, development of the SOI wafer and the manufacturing method thereof that their manufacturing steps themselves are not complicated, the number of defects on the bonding interface is not practically the problem and the interface state density (Dit) for trapping carries on the interface between the BOX layer and the base wafer is high has been waited.

Thus, the present inventors have repeatedly conducted keen examination about the configuration of the SOI wafer and the manufacturing method thereof that can increase the interface state density without forming the intermediate layer on the interface between the BOX layer and the base wafer.

As a result, the present inventors have discovered that the above-described problem can be solved by using the silicon single crystal wafer which has dangling bonds on the wafer surface that determine the number of interface states larger in number than those of a generally utilized silicon single crystal wafer having the plane orientation (100) and which has the plane orientation different from (100).

Figure 1:
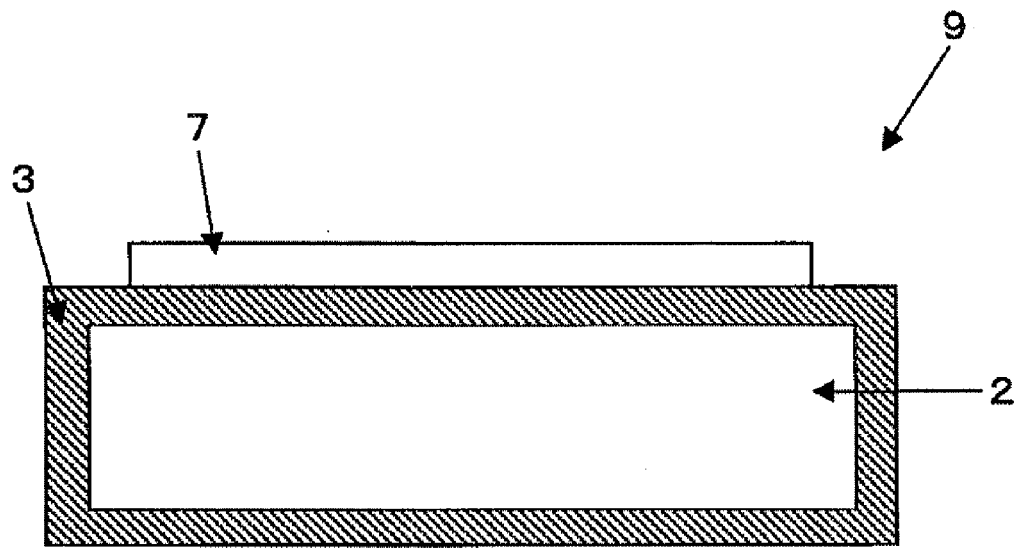
FIG. 1(a)-(b) is a schematic cross-sectional view showing an example of a configuration of the SOI wafer according to the present invention.
Figure 1:
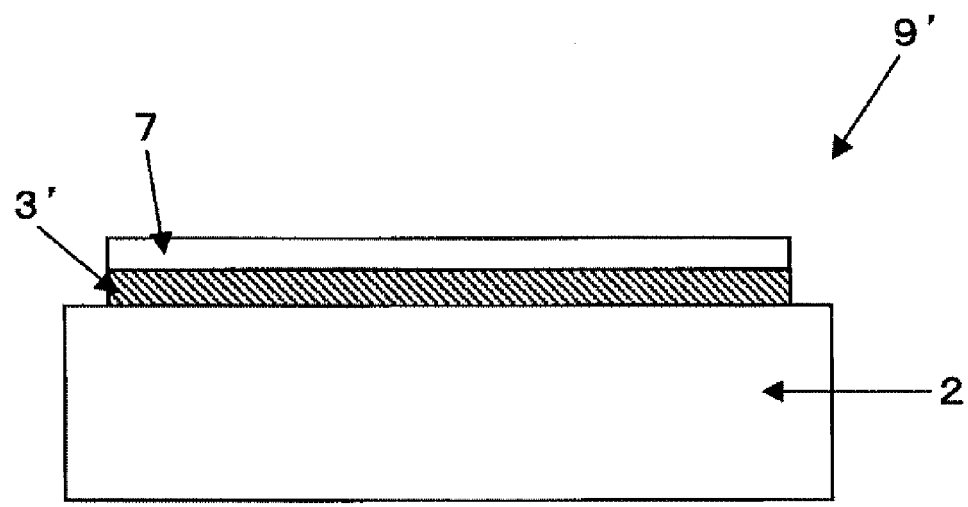

Hereinafter, the present invention will be explained more in detail referring to attached figures. However, the present invention is not restricted thereto. FIG. 1 is a schematic cross-sectional view showing an example of a configuration of an SOI wafer according to the present invention.

As shown in FIG. 1(a), an SOI wafer 9 according to the present invention has at least an SOI layer 7, a BOX layer 3 as a silicon oxide film and a base wafer 2.

Further, this SOI layer 7 has a plane orientation of (100), and the base wafer 2 has a resistivity of 100 Ω·cm or more and a plane orientation different from (100).

Here, as another example of the SOI wafer according to the present invention, as depicted in FIG. 1(b), a BOX layer 3' as a silicon oxide film of an SOI wafer 9' may be interposed between an SOI layer 7 and a base wafer 2 alone. Of course, in this case, likewise, the SOI layer 7 has the plane orientation of (100), and the base wafer 2 has the resistivity of 100 Ω·cm or more and the plane orientation different from (100).

When the base wafer has the resistivity which is as high as 100 Ω·cm or more and has the plane orientation different from (100) that has dangling bonds on the surface larger in number than those of the silicon single crystal wafer having the plane orientation (100), the interface state density between the BOX layer and the base wafer can be increased. When carriers are trapped in this interface state, it is possible to suppress a reduction in apparent resistivity caused due to production of the reversal layer in case of using the high-resistivity base wafer, whereby the SOI wafer having excellent RF characteristics can be obtained. Therefore, the SOI wafer that can reduce a power consumption/crosstalk can be provided.

Further, since the silicon single crystal wafer and the oxide film are utilized for the configuration, crystallinity is good, the configuration itself is not complicated and is equal to that of a regular SOI wafer, and hence manufacture can be carried out with a good yield ratio at a low cost.

Here, the base wafer 2 has plane orientation of (110), or has plane orientation of (111), or the base wafer 2 is subjected to off-angle of 1 degree or above and less than 45 degrees from (100).

When the silicon single crystal wafer having the above-described plane orientation is used as the base wafer as described above, the interface state density between the BOX layer and the base wafer can be increased, and the reduction in apparent resistivity caused due to generation of the reversal layer can be further suppressed.

Such the SOI wafer according to the present invention can be manufactured based on the following steps, and the example of the steps will be explained below, but a method for manufacturing an SOI wafer according to the present invention is not restricted to the following description.

Figure 2:
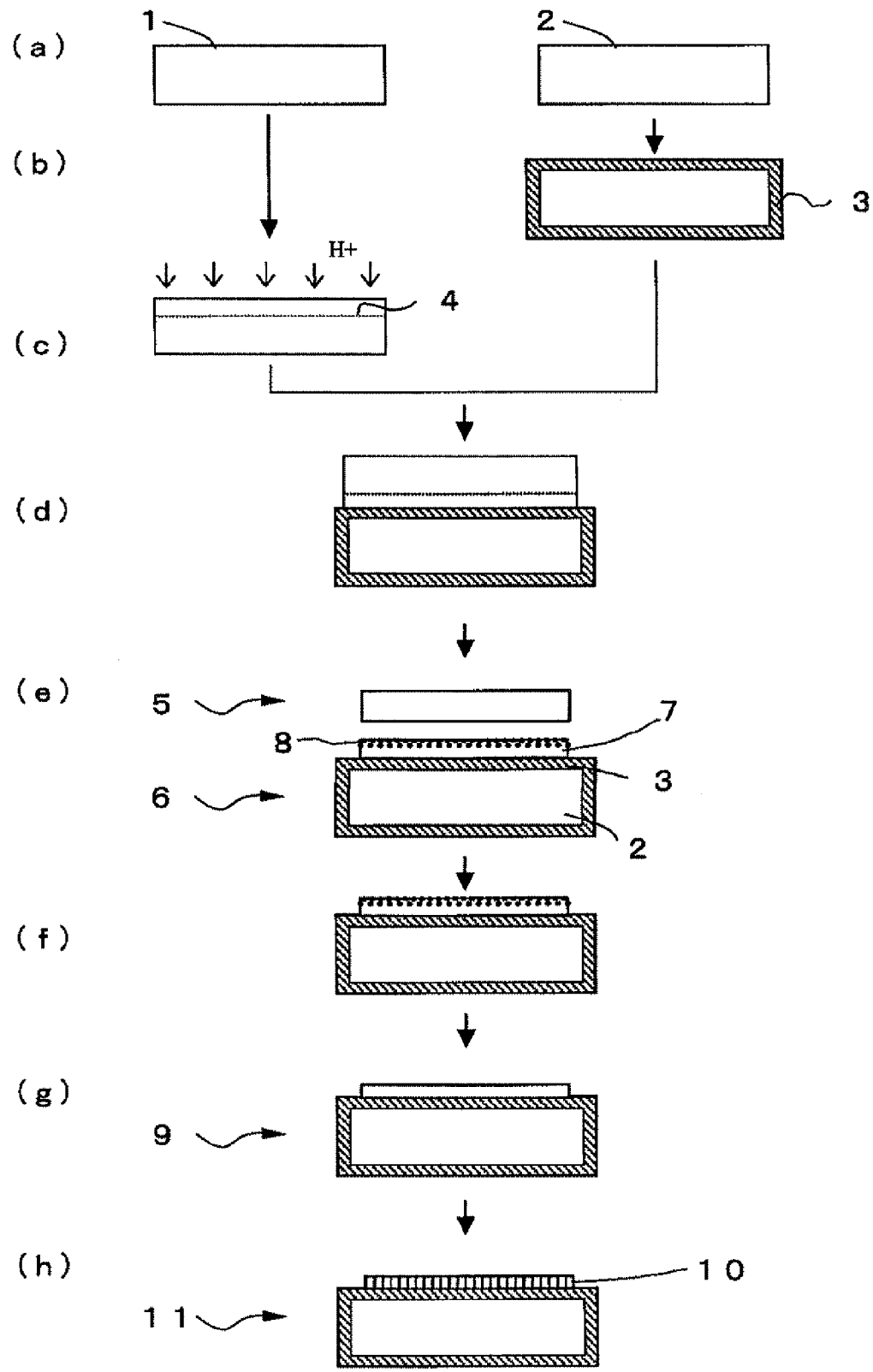
FIG. 2(a)-(h) is a process flow showing an example of manufacturing steps of the SOI wafer according to the present invention.

FIG. 2 is a process flow showing an example of steps in a method for manufacturing the SOI wafer according to the present invention.

(Step a: Preparation of Wafer)

First, as shown in FIG. 2(a), a bond wafer 1 and a base wafer 2 are prepared.

Here, a silicon single crystal wafer having a plane orientation of (100) is prepared as the bond wafer 1, and a silicon single crystal wafer having a resistivity of 100 Ω·cm or more and a plane orientation different from (100) is prepared as the base wafer 2. Setting the resistivity to 1000 Ω·cm or more is preferable, but an upper limit of the resistivity is not restricted in particular, and the resistivity of $10^4$ Ω·cm, $10^5$ Ω·cm or more may be adopted.

Here, as the base wafer 2, a silicon single crystal wafer having plane orientation of (110), or having plane orientation of (111), or the silicon single crystal wafer subjected to off-angle of 1 degree or above and less than 45 degrees from (100) can be prepared.

When the above-described silicon single crystal wafer having dangling bonds on the surface thereof larger in number than those of the silicon single crystal wafer having the plane orientation of (100) is used as the base wafer, the SOI wafer having the high interface state density between the BOX layer and the base wafer can be obtained, whereby the SOI wafer having the reduced power consumption can be manufactured. Furthermore, when these plane orientations are adopted, the wafer can be easily obtained by growing a single crystal based on a Czochralski method and performing a predetermined treatment.

(Step b: Formation of Silicon Oxide Film (BOX Layer))

Then, as shown in FIG. 2(b), a silicon oxide film 3 that becomes a BOX layer is formed on at least one of the base wafer 2 and the bond wafer 1 (here, the silicon oxide film 3 is formed on the base wafer 2).

It is general to form the silicon oxide film on the bond wafer, bond the bond wafer to the base wafer and determine the bonding interface as the interface between the BOX layer and the base layer to manufacture the SOI wafer in conventional examples, but the method for manufacturing the SOI wafer according to the present invention is the method for manufacturing the SOI wafer having the high interface state density resulting from the plane orientation of the base wafer, and hence the silicon oxide film 3 can be formed on the base wafer 2 in this manner. Therefore, it is possible to easily cope with the situation where the oxide film is formed on the base wafer, e.g., the situation where warpage of the SOI wafer must be reduced or the situation where the thick BOX layer is required in the ion implantation and delamination method, thereby increasing the interface state density.

(Step c: Ion Implantation)

Subsequently, as shown in FIG. 2(c), at least one of the hydrogen ions and the rare gas ions are implanted into one main surface of the bond wafer 1 to form an ion-implanted layer 4.

(Step d: Bonding)

Then, as shown in FIG. 2(d), with the surface of the bond wafer 1 having the ion-implanted layer 4 formed thereon being determined as a bonding surface, the bond wafer 1 and the base wafer 2 are closely contacted and bonded to each other through the silicon oxide film 3.

(Step e: Delamination)

Subsequently, as shown in FIG. 2(e), when the bond wafer 1 is delaminated at the ion-implanted layer 4 formed at the previous step, an SOI layer 7 is formed on the base wafer 2 to sandwich the BOX layer 3, thereby obtaining a bonded substrate 6 having an ion implantation damage layer 8 and a delaminated bond wafer 5. This delaminated bond wafer 5 can be reused as a bond wafer after removing defects on a cleavage plane.

It is to be noted that this reduction in film thickness is performed in a step order of performing bonding at a room temperature, then carrying out a low-temperature heat treatment at approximately 500° C. to delaminate as required, and subsequently performing a bonding heat treatment (f) for increasing bonding strength. Furthermore, at this time, it is also possible to adopt a method for delaminating at the ion-implanted layer with use of a mechanical stress without performing the heat treatment at approximately 500° C. when the bonding wafer surface is subjected to a plasma treatment to achieve activation and then bonding is carried out.

(Step f: Bonding Heat Treatment)

Thereafter, as shown in FIG. 2(f), the bonding heat treatment can be carried out with respect to the bonded substrate 6. For example, when a heat treatment is performed in an oxidizing or inert gas atmosphere at 1000° C. to 1200° C. for 10 minutes to 6 hours, the two wafers can be strongly bonded to each other.

(Step g: Flattening Treatment)

Then, as shown in FIG. 2(g), to remove the ion implantation damage layer 8 on the surface of the SOI layer 7 of the bonded substrate 6 subjected to the bonding heat treatment, the SOI layer 7 is subjected to a flattening treatment to obtain an SOI wafer 9.

As this flattening treatment, for example, chemical mechanical polishing (CMP) or a high-temperature heat treatment can be conducted.

(Step h: Formation of RF Device)

Subsequently, as shown in FIG. 2(h), a semiconductor device 11 can be manufactured by forming an RF device 10 on the SOI layer 7 of the manufactured SOI wafer 9.

As described above, since the SOI wafer according to the present invention has excellent RF characteristics and good crystallinity and does not have the complicated configuration, forming the RF device on the SOI layer of the SOI wafer described above enables manufacturing a semiconductor device having excellent RF characteristics with the high yield ratio at the low cost.

Figure 3:
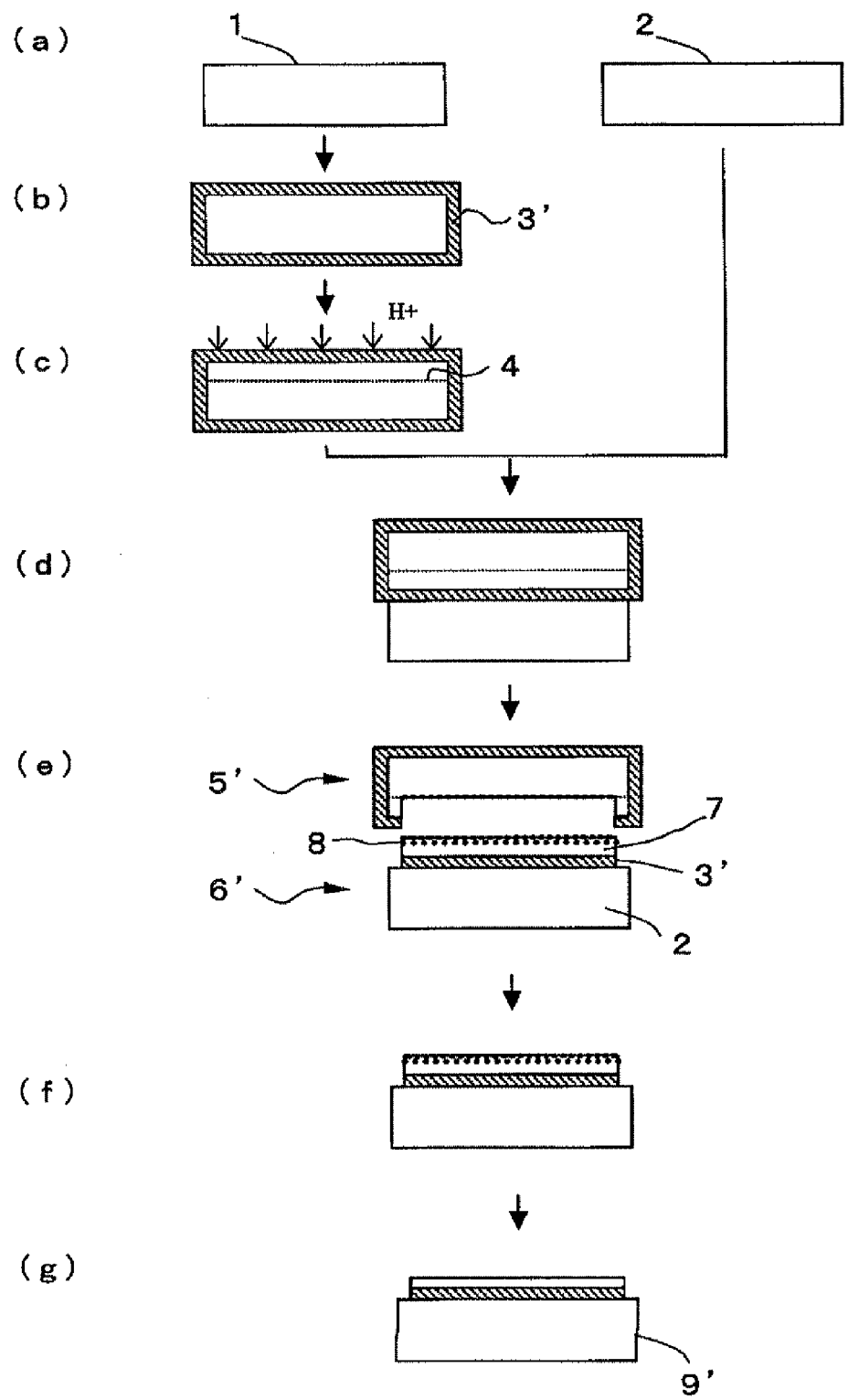
FIG. 3(a)-(g) is a process flow showing another example of manufacturing steps of the SOI wafer according to the present invention.

In regard to the method for manufacturing an SOI wafer, the example of forming the silicon oxide film on the base wafer has been described, but a silicon oxide film 3' that becomes a BOX layer can be formed on the bond wafer 1 as shown in FIG. 3.

In this case, at least one of the hydrogen ions and the rare gas ions are implanted into the bond wafer 1 having the silicon oxide film 3' formed thereon to form an ion-implanted layer 4 as shown in FIG. 3(c), and then the bond wafer having the silicon oxide film 3' formed thereon is closely contacted and bonded to the base wafer 2 through the silicon oxide film 3' with the surface having the ion-implanted layer 4 formed thereon being determined as a bonding surface as shown in FIG. 3(d). In this case, an oxide film may be also formed on the base wafer 2 as required.

Then, as shown in FIG. 3(e), when the bond wafer having the silicon oxide film 3' formed thereon is delaminated at the ion-implanted layer 4, the SOI layer 7 is formed on the bond wafer 2 to sandwich a BOX layer 3', thereby obtaining a bonded substrate 6' having the ion implantation damage layer 8 and a delaminated bond wafer 5'.

Subsequently, the bonded substrate 6' is subjected to the bonding heat treatment as shown in FIG. 3(f), and then the flattening treatment is carried out with respect to the SOI layer 7 on the bonded substrate 6' subjected to the bonding heat treatment, thereby obtaining an SOI wafer 9'.

Moreover, in the above example, a film thickness of the bond wafer is reduced by delaminating the bond wafer based on the ion implantation and delamination method, but the present invention is not restricted thereto, and the film thickness can be reduced by a method using surface grinding and mirror polishing preferable for formation of an SOI layer having a relatively large film thickness.

As described above, according to the method for manufacturing an SOI wafer of the present invention, although the configuration is simple, the crystallinity is good, and carriers can be trapped by increasing the interface state density (Dit). Therefore, the SOI wafer that can suppress degradation in electrical characteristics due to the reversal layer of the base wafer having the high resistivity can be manufactured with the good yield ratio at the low cost.

Hereinafter, the present invention will be explained in more detail based on Examples and Comparative Example, but the present invention is not of course restricted thereto.

Example 1

Manufacture of SOI Wafer

An SOI wafer was manufactured by such the method for manufacturing an SOI wafer as depicted in FIG. 2.

Specifically, a silicon single crystal wafer (a resistivity: 10 $\Omega$·cm) having a diameter of 300 mm and a plane orientation of (100) was used as a bond wafer, and hydrogen ions were implanted from a surface thereof to form an ion-implanted layer therein. On the other hand, a silicon single crystal wafer (a resistivity: 1000 $\Omega$·cm) having a plane orientation of (110) was used as a base wafer, and an oxide film of 150 nm as a BOX layer was formed on a surface thereof by a heat treatment.

Thereafter, the surface of the bond wafer subjected to the ion implantation was bonded to the oxide film surface of the base wafer, and the heat treatment was performed to delaminate at the ion-implanted layer, thereby manufacturing the SOI wafer having the SOI layer having the plane orientation of (100) and the thickness of 150 nm. At this time, defects on the bonding interface, e.g., voids or blisters were not generated.

Then, a cleavage plane of the SOI layer was subjected to a flattening treatment, thereby bringing the SOI wafer (the SOI layer of 70 nm) on which an RF device is to be formed to completion.

[Measurement of Interface State Density (Dit) and Electron Mobility]

On the other hand, for the purpose of measuring the interface state density of the interface between the BOX layer and the base wafer, a silicon single crystal wafer having the same specification as the bond wafer and the base wafer utilized in [Manufacture of SOI Wafer] was prepared.

Figure 4:
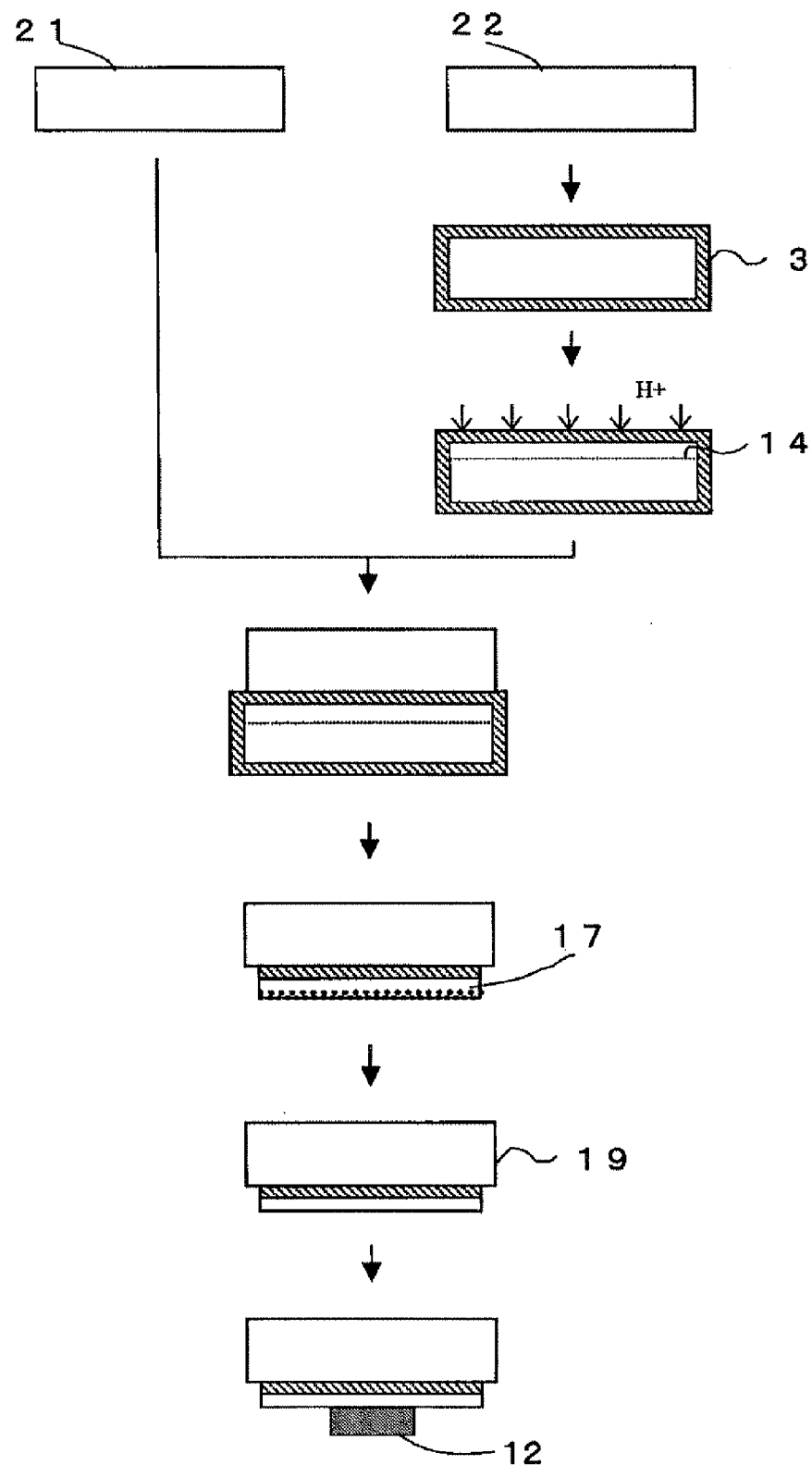
FIG. 4 is a process flow showing manufacturing steps of an evaluation SOI wafer according to Example 1.

However, to simulate a configuration of the SOI wafer, like a manufacturing process flow of an evaluation SOI wafer depicted in FIG. 4, a silicon single crystal wafer prepared as the bond wafer was determined as a base wafer (tentative) 21, and a wafer prepared as the base wafer was determined as a bond wafer (tentative) 22, hydrogen ions were implanted into the bond wafer (tentative) 22 having an oxide film of 150 nm formed thereon to form an ion-implanted layer 14, bonding to the base wafer (tentative) 21 and a heat treatment were carried out to delaminate at the ion-implanted layer 14, an SOI layer 17 having a plane orientation of (110) and a thickness of 150 nm was thereby formed, and then a bonding heat treatment and a flattening treatment were performed to reduce a thickness of the SOI layer 17 to 70 nm, thus manufacturing an evaluation SOI wafer 19.

Additionally, the interface state density (Dit) and electron mobility on the interface of the SOI layer 17 of (110) and the BOX layer 3 (i.e., structurally equivalent to the interface of the BOX layer 3 and the base wafer 2 of the SOI wafer 9 manufactured in [Manufacture of SOI wafer] in FIG. 2) were measured based on such a pseudo MOSFET method that can evaluate electrical characteristics of the interface of the BOX layer and the SOI layer by bringing a mercury probe 12 into contact with the SOI layer 17 as disclosed in Japanese Patent Application Laid-open No. 2006-13100.

Table 1 shows a measurement result of interface state densities (Dit) and electron mobility of such six evaluation SOI wafers 19 (Samples A to F). Here, a unit of Dit is [$\times 10^{11}$/cm$^2$/eV] and a unit of the electron mobility is [cm$^2$/V/s].

TABLE 1

| | Dit [$10^{11}$/cm$^2$/eV] | Electron mobility [cm$^2$/V/s] |
|---|---|---|
| Sample A | 33.2 | 459 |
| Sample B | 31.0 | 456 |
| Sample C | 31.7 | 465 |
| Sample D | 29.5 | 490 |
| Sample E | 27.1 | 476 |
| Sample F | 26.9 | 468 |
| Average | 29.9 | 469 |

Comparative Example 1

[Manufacture of SOI Wafer] and [Measurement of Interface State Density (Dit) and Electron Mobility] were carried out based on the same process as Example 1 except that the silicon single crystal wafer having the plane orientation of (100) was utilized for both the bond wafer and the base wafer. Table 2 shows a measurement result of interface state densities (Dit) and electron mobility of six evaluation SOI wafers (Samples G to L).

TABLE 2

|  | Dit [$10^{11}$/cm$^2$/eV] | Electron mobility [cm$^2$/V/s] |
| --- | --- | --- |
| Sample G | 7.3 | 628 |
| Sample H | 7.4 | 623 |
| Sample I | 6.3 | 650 |
| Sample J | 6.1 | 646 |
| Sample K | 6.0 | 642 |
| Sample L | 6.1 | 619 |
| Average | 6.5 | 635 |

It was revealed from Example 1 and Comparative Example 1 that the interface of the BOX layer and the base wafer in the SOI wafer according to Example 1 using the (110) wafer for the base wafer has Dit increased to 4.5-times or more of that of the interface of the SOI wafer according to Comparative Example 1 using the (100) wafer on average and that the electron mobility of the same was reduced to 75% or below.

Example 2·Comparative Example 2

Figure 5:
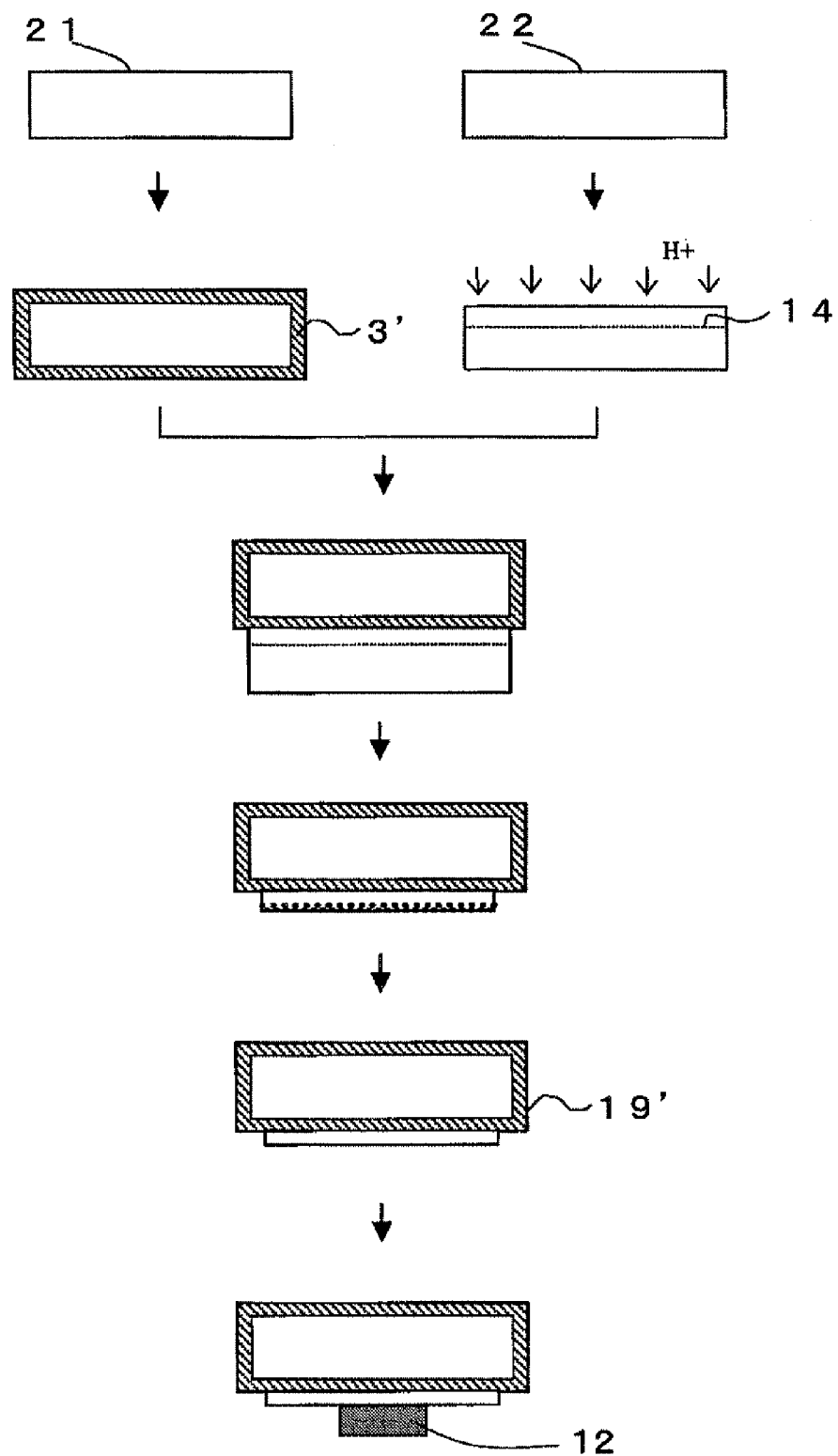
FIG. 5 is a process flow showing manufacturing steps of an evaluation SOI wafer according to Example 2.

An SOI wafer 9' and an evaluation SOI wafer 19' were manufactured based on the same process as Example 1 and Comparative Example 1 except that an oxide film was formed on a bond wafer without forming an oxide film on a base wafer, and interface state densities and electron mobility were evaluated under the same conditions (see FIG. 3 in regard to manufacturing steps of the SOI wafer 9', and see FIG. 5 in regard to the evaluation wafer 19').

As a result, the interface state density (Dit) and the electron mobility of the interface between the BOX layer and the base wafer in the SOI wafer according to each of Example 2 and Comparative Example 2 were substantially equal to those according to each of Example 1 and Comparative Example 1, and it was revealed that Dit in the case using the (110) wafer for the base wafer (Example 2) was increased to 4.5-times or more of that in the case using (100) wafer (Comparative Example 2) on average and that the electron mobility of the same was reduced to 75% or below.

Example 3

[Manufacture of SOI Wafer] and [Measurement of Interface State Density (Dit) and Electron Mobility] were carried out based on the same process as Example 1 except that a wafer having a plane orientation of (111) was used for a base wafer.

In regard to an interface state density (Dit) and electron mobility of a manufactured SOI wafer, Dit was increased to 5-times or more of that in Comparative Example 1 and the electron mobility was reduced to 70% or below.

Example 4

[Manufacture of SOI Wafer] and [Measurement of Interface State Density (Dit) and Electron Mobility] were carried out based on the same process as Example 1 except that a wafer having a plane orientation subjected to off-angle of 4 degrees from (100) was used for a base wafer.

An interface state density (Dit) of a manufactured SOI wafer was increased to approximately 3.5-times of that in Comparative Example 1, and electron mobility was reduced to approximately 80% of that in Comparative Example 1.

As described above, according to the present invention, it was revealed that the SOI wafer having the high interface state density (Dit) for trapping carriers on the interface between the BOX layer and the base wafer without complicating the manufacturing steps themselves of the SOI wafer can be provided.

It is to be noted that the present invention is not restricted to the foregoing embodiment. The foregoing embodiment is just an exemplification, and any examples that have substantially the same configuration and exercise the same functions and effects as the technical concept described in claims according to the present invention are included in the technical scope of the present invention.

The invention claimed is:

1. An SOI wafer comprising at least:
    an SOI layer;
    a silicon oxide film; and
    a base wafer,
   wherein:
    the SOI layer has a plane orientation of (100);
    the base wafer has a resistivity of 100 Ω·cm or more; and
    the base wafer has a plane orientation of (110), the base wafer has a plane orientation of (111), or the base wafer has a plane orientation that has an off-angle of 1 degree or more and less than 45 degrees from (100).

2. A semiconductor device comprising at least an RF device formed on the SOI layer of the SOI wafer according to claim 1.

3. A method for manufacturing an SOI wafer comprising at least:
    bonding a base wafer and a bond wafer, each of which is formed of a silicon single crystal, to each other through a silicon oxide film; and
    reducing a film thickness of the bond wafer to form an SOI layer, wherein:
    the bond wafer has a plane orientation of (100);
    the base wafer has a resistivity of 100 Ω·cm or more; and
    the base wafer has a plane orientation of (110), the base wafer has a plane orientation of (111), or the base wafer has a plane orientation that has an off-angle of 1 degree or more and less than 45 degrees from (100).

4. The method for manufacturing an SOI wafer according to claim 3, wherein the bond wafer has an ion-implanted layer formed near a surface thereof by implanting at least one of a hydrogen ion and a rare gas ion from the surface thereof, and a film thickness of the bond wafer is reduced by bonding the bond wafer to the base wafer through the silicon oxide film and then performing delamination at the ion-implanted layer.

5. The method for manufacturing an SOI wafer according to claim 4, wherein the silicon oxide film is formed on a surface of the base wafer and then the base wafer is bonded to the bond wafer.

* * * * *